(12) United States Patent  
Chuang et al.

(10) Patent No.: US 9,132,574 B2  
(45) Date of Patent: Sep. 15, 2015

(54) METHOD FOR PRODUCING SUBSTRATE WITH A MICROSTRUCTURE

(71) Applicant: Southern Taiwan University of Science and Technology, Tainan (TW)

(72) Inventors: Cheng-Hsin Chuang, Tainan (TW); Ming-Yu Chen, Tainan (TW)

(73) Assignee: Southern Taiwan Unviersity of Science and Technology, Tainan (TW)

( * ) Notice: Subject to any disclaimer, the term of this patent is extended or adjusted under 35 U.S.C. 154(b) by 38 days.

(21) Appl. No.: 13/784,145

(22) Filed: Mar. 4, 2013

(65) Prior Publication Data

US 2013/0302567 A1   Nov. 14, 2013

(30) Foreign Application Priority Data

May 9, 2012   (TW) .............................. 101116432 A

(51) Int. Cl.
  *B29C 41/14*   (2006.01)
  *G03F 7/00*    (2006.01)
  *B29C 33/38*   (2006.01)
  *B29C 33/42*   (2006.01)

(52) U.S. Cl.
  CPC ............. *B29C 41/14* (2013.01); *B29C 33/3878* (2013.01); *G03F 7/0002* (2013.01); *B29C 33/424* (2013.01); *Y10T 428/24479* (2015.01)

(58) Field of Classification Search
  None
  See application file for complete search history.

(56) References Cited

U.S. PATENT DOCUMENTS

2008/0229941 A1\* 9/2008 Heidari ........................... 101/23  
2009/0166914 A1\* 7/2009 Ogino et al. ................... 264/175  
2013/0284354 A1\* 10/2013 Lee et al. ....................... 156/247

FOREIGN PATENT DOCUMENTS

| KR | 1114916 B1 \* | 2/2012 | ................... 156/247 |
| TW | I221826 | 10/2004 | |
| TW | 200817778 TW | 4/2007 | |
| TW | I315321 | 10/2009 | |

OTHER PUBLICATIONS

Nam et al, Close-Packed Hemispherical Microlens Array from Two-Dimensional Ordered Polymeric Microspheres, Langmuir, Jul. 22, 2006, vol. 22, Iss 17, pp. 7358-7363.\*

(Continued)

*Primary Examiner* — Benjamin Schiffman  
(74) *Attorney, Agent, or Firm* — Muncy, Geissler, Olds & Lowe, P.C.

(57) ABSTRACT

Disclosed are a substrate with a microstructure and a method for producing the same. In this method microparticles of a random allocation by means of a natural self-assembly mechanism are used to coat on a master mold. Firstly, hollow micro glass particles within a specific size range are mixed with a UV-curable adhesive to become a mixed solution. Afterwards, the master mold is dip-coated in the mixed solution and the microparticles coated on the master mold are self-assembled. To fix the microparticles on the master mold to form a sphere array microstructure with a three dimensional random allocation, a UV light source is used to radiate the master mold for curing. Afterwards, an inverse mold with the corresponding microstructure is fabricated by electroforming or polydimethylsiloxane (PDMS) casting the master mold. Thus, the inverse mold can be applied to the fabrication of a substrate with the corresponding microstructure.

8 Claims, 8 Drawing Sheets

(56) References Cited

OTHER PUBLICATIONS

Slow Vertical Deposition of Colloidal Crystals: A Langmuir-Blodgett Process? Robert G. Shimmin, Alexander J. DiMauro, and, and Paul V. Braun, Langmuir Jun. 15, 2006 22 (15), 6507-6513.*

Karl-Ulrich Fulda and Prof. Bernd Tieke, Langmuir films of monodisperse 0.5 μm spherical polymer particles with a hydrophobic core and a hydrophilic shell, Advanced Materials, vol. 6, Issue 4, pp. 288-290, Apr. 1994.*

Synthesis of Colloidal Crystals of Controllable Thickness through the Langmuir-Blodgett Technique, Stéphane Reculusa and and Serge Ravaine, Chemistry of Materials Jan. 3, 2003 15 (2), 598-605.*

Surface Features in Langmuir-Blodgett Monolayers of Predominantly Hydrophobic Poly(styrene)-Poly(ethylene oxide) Diblock Copolymer, C. A. Devereaux and and S. M. Baker, Macromolecules Jan. 26, 2002 35 (5), 1921-1927.*

* cited by examiner

METHOD FOR PRODUCING SUBSTRATE WITH A MICROSTRUCTURE

CROSS-REFERENCE TO RELATED APPLICATION

This application claims priority from Taiwan Patent Application No. 101116432, filed on May 9, 2012, the contents of which are hereby incorporated by reference in their entirety for all purposes.

BACKGROUND OF THE INVENTION

1. Field of the Invention

The present invention relates to a substrate with a microstructure and method for producing the same, and particularly, a substrate with a microstructure and method for producing the same by using a non-aqueous self-assembly process.

2. Description of the Related Art

Self-assembly is a microscopic phenomenon existed in nature. This begins with the permeation of a plurality of micro-/nano-particles into an aqueous solution. Evaporation of the solution will cause the liquid level of the aqueous solution to lower down, thus the mutually interactive forces of the particles force them to aggregate and align with each other. This is the self-assembly happened naturally.

Generally speaking, nano scale particles are traditionally used in research and manufacturing, then the self-assembly structure is reproduced to obtain the required inverse mold. Furthermore, surface modification of the substrate and controlling environmental humidity are necessary to obtain a better particle adhesion and a monolayer self-assembly structure. In other words, implementing this manufacturing process will increase the cost expense.

There are other methodologies of manufacturing microstructures. For example, Taiwan invention patent (Publication Number: 200817778) discloses a partially immersed monolayer particles, wherein an aqueous adhesive is mixed with colloidal particles to perform the self-assembly process and to form a structure membrane. Furthermore, controlling the liquid evaporation self-assembly is required in this patent (forming the substrate and the monolayer structure through water in a humid environment). Besides, the constant-diameter microparticles are polymer particles with the diameter between 1-20 μm. Moreover, the generated membrane includes the physically monolayer arranged particles partially immersed in the adhesive. The drawback of this process is that it is required to control the liquid evaporation speed to reach the self-assembly purpose. However, this is not easy to achieve in practical implementation. Besides, the requirement of the constant-diameter microparticles is expensive in cost.

Additionally, the Taiwanese patent (Patent Number: I221826) discloses a mold manufacturing method by utilizing a chemical self-assembly process. This method mainly relies on the chemical self-assembly process to form a self-assembled monolayer (SAM) membrane on a substrate, then disposes a particle-containing solution over the chemical membrane to form a particle layer with a specific arrangement. Afterwards, this particle layer is used as a master mold to manufacture molds by electroforming. Besides, the surface of the substrate is processed and able to form chemical bonds with bifunctional group molecules, then perform the electroforming after the allocation of the self-assembly particles. However, the drawback of this method is that a chemical layer must be generated on the surface of the substrate in advance to activate the self-assembly with the particles. This manufacturing process is complex, time-consuming, and expensive.

Additionally, the Taiwanese patent (Patent Number: I315321) discloses a lens array manufacturing method, a lens array, and its optical device array apparatus. First, a self-assembled monolayer is generated on a substrate to form a hydrophilic area and a hydrophobic area. Afterwards, a liquid material is spread on the substrate to generate a plurality of liquid lenses on the hydrophilic area, then the plurality of liquid lenses are cured to form the lens array. However, the drawback of this method is a hydrophilic area and a hydrophobic area must be generated in advance on the surface of the substrate, such that liquid lenses can be generated on the hydrophilic area and solidified. This manufacturing process is complex, time-consuming, and expensive.

SUMMARY OF THE INVENTION

Based on the problems of the prior arts, one of the objects of the present invention is to provide a substrate with a microstructure and method for producing the same. The present invention mainly utilizes a non-aqueous self-assembly method to reduce the complexity of the manufacturing process and the required cost expense.

The substrate with a microstructure and method for producing the same of the present invention comprises the following steps: provide a mixed solution and a master mold, wherein the mixed solution comprises a plurality of particles and an optical curing adhesive, and the master mold is dip-coated in the mixed solution such that the plurality of particles are self-assembled on the surface of the master mold; provide the master mold with a light source, wherein the plurality of particles self-assembled on the master mold are fixed on the master mold by the curing of the optical curing adhesive; perform a replication step to provide an inverse mold with a concave surface and the concave surface is corresponding to shapes of the plurality of the particles on the master mold; and perform an imprint step, wherein the inverse mold is used to imprint a substrate to form a microstructure on a surface of the substrate and the shape of the microstructure is corresponding to that of the convex surface.

Furthermore, the master mold is a hollow master mold or a planar master mold.

Furthermore, the hollow master mold is a hollow round cylinder, a hollow squared tube, or a hollow elliptical tube.

Furthermore, the planar master mold is a caterpillar belt or a planar belt.

Furthermore, the inverse mold is fabricated by electroforming or polydimethylsiloxane (PDMS) casting.

Furthermore, the inverse mold further comprises a mandrel such that the inverse mold is enabled to continuously perform the imprint step by using the mandrel. Furthermore, the inverse mold is a roller mold.

Furthermore, the optical curing adhesive is a UV-curable adhesive.

Furthermore, the volume proportion of the particles to the optical curing adhesive is 2~50%.

Additionally, the present invention further proposes a substrate with a microstructure, wherein it is fabricated by using the aforementioned method.

As above-mentioned the substrate with a microstructure and method for producing the same of the present invention may have one or more characteristics and advantages as described below:

the substrate with a microstructure and method for producing the same of the present invention mainly utilizes the self-assembly process of the optical curing adhesive and the particles. In the present invention the forming of the self-assembly structure is by simply controlling the volume proportion (volume of particles/volume of liquid solution) of the mixed solution and the speed of the master mold separated from the mixed solution as well as matching with particles of various sizes.

DETAILED DESCRIPTION OF THE PREFERRED EMBODIMENTS

Figure 1A:
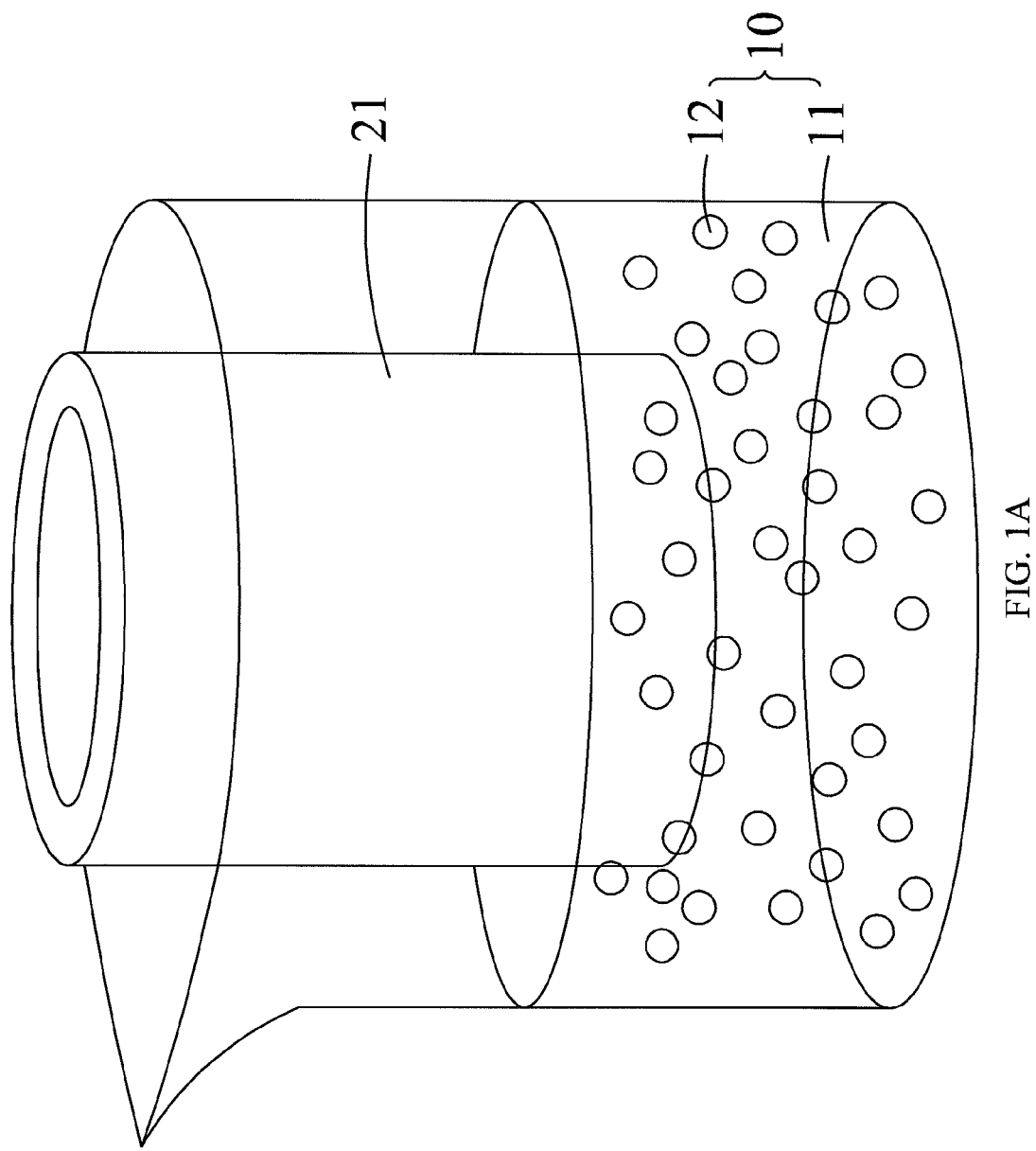
FIG. 1A is a diagram showing a method for producing a substrate with a microstructure in a vertical stretching manner according to the preferred embodiment of the present invention.
Figure 1B:
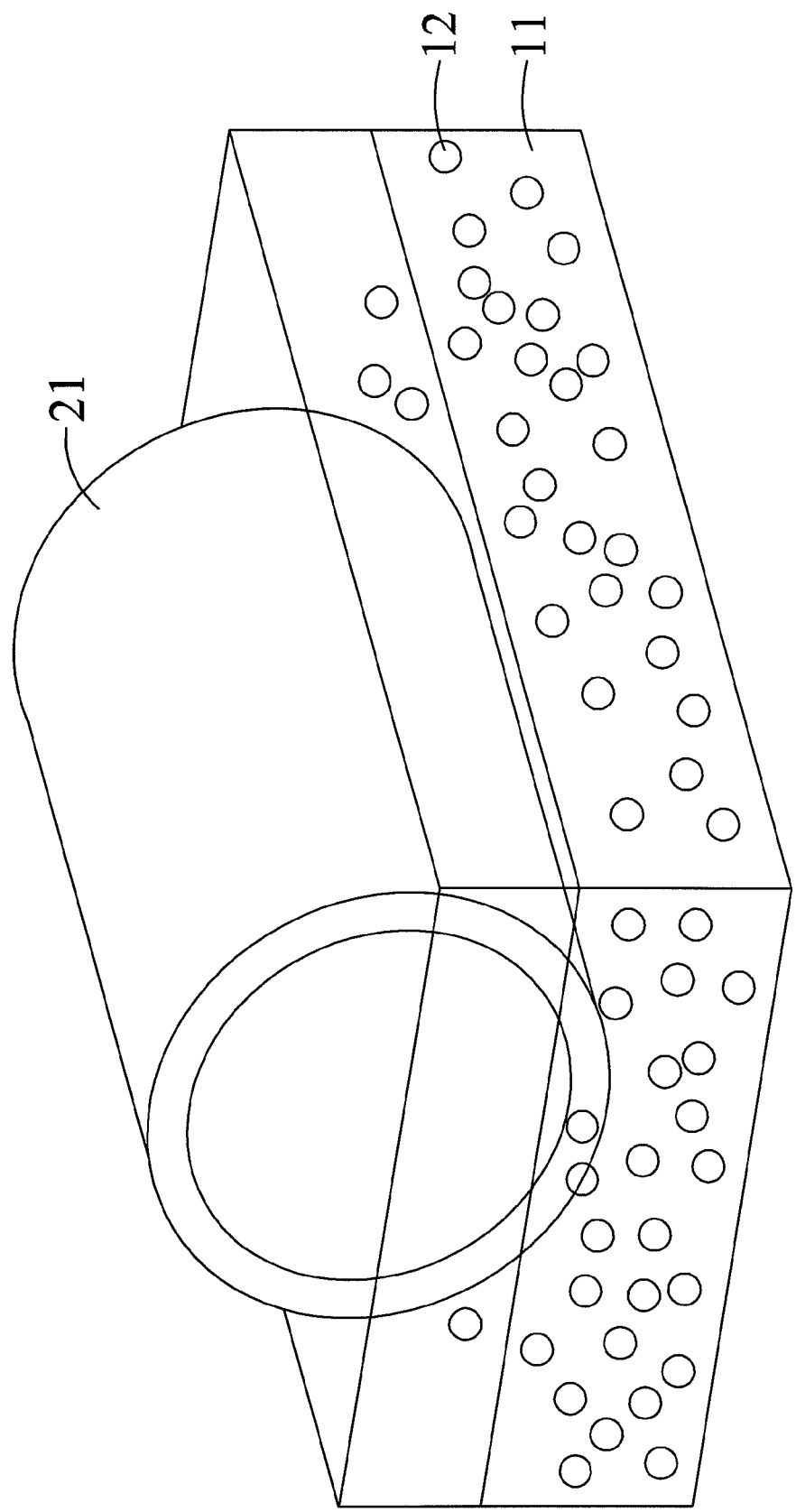
FIG. 1B is a diagram showing a method for producing a substrate with a microstructure in a horizontal rotation manner according to the preferred embodiment of the present invention.
Figure 7:
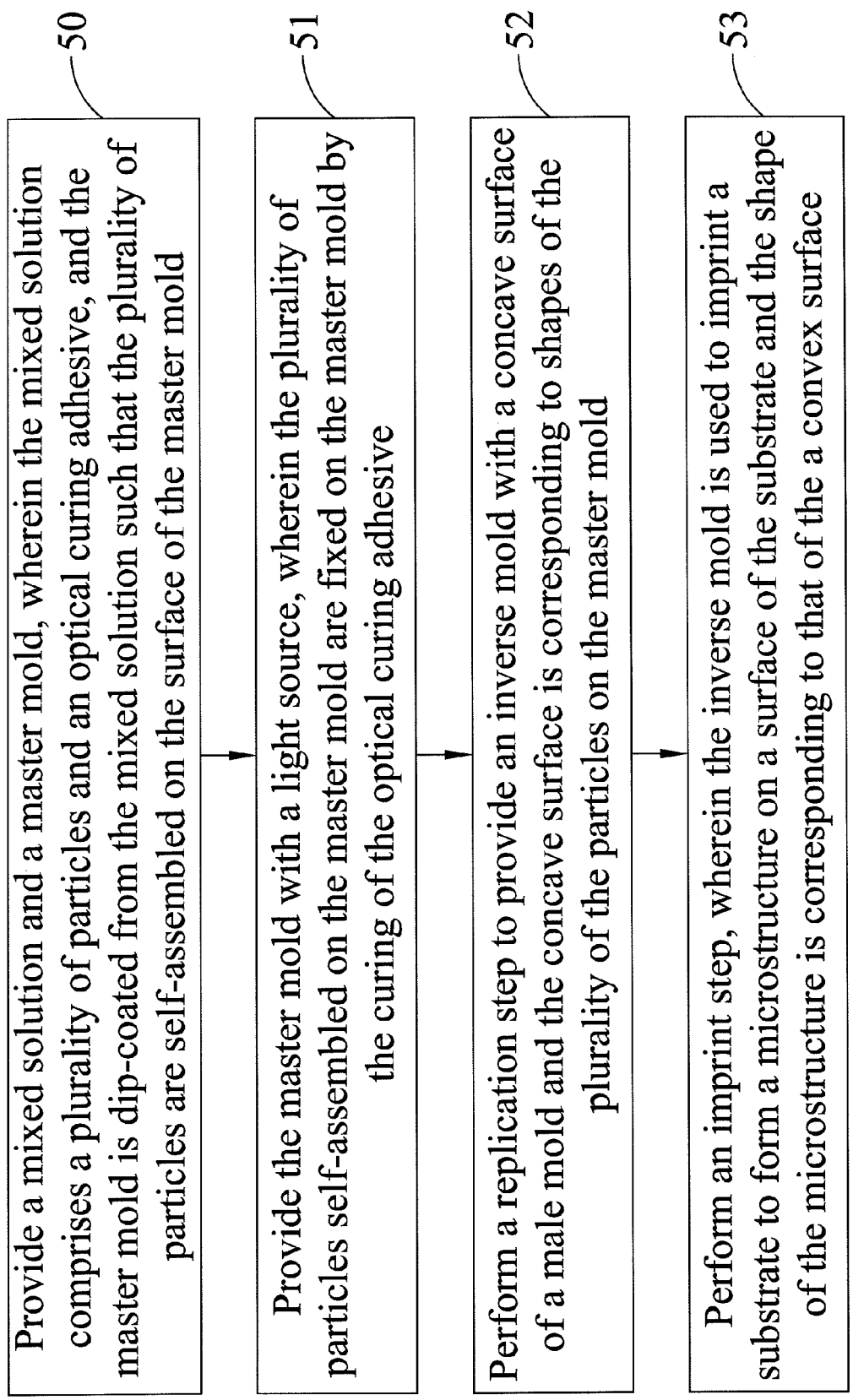
FIG. 7 is the process diagram showing a method for manufacturing a substrate with a microstructure and method for producing the same according to the preferred embodiment of the present invention.

Referring to FIGS. 1A, 1B, and 7, FIG. 1A is a diagram showing a method for producing a substrate with a microstructure in a vertical stretching manner according to the preferred embodiment of the present invention, FIG. 1B is a diagram showing a method for producing a substrate with a microstructure in a horizontal rotation manner according to the preferred embodiment of the present invention, and FIG. 7 is the process diagram showing a method for manufacturing a substrate with a microstructure and method for producing the same according to the preferred embodiment of the present invention. In FIGS. 1A, 1B, and 7, the substrate with a microstructure and method for producing the same comprises the following steps: provide a mixed solution 10 and a master mold 21 in Step 50, wherein the mixed solution 10 comprises a plurality of particles 12 and an optical curing adhesive 11, and the master mold 21 is dip-coated in the mixed solution 10 such that the plurality of particles 12 are self-assembled on a surface of the master mold 21. Specifically, the master mold 21 is preferred to be a hollow master mold or a planar master mold. Furthermore, the hollow master mold is preferred to be a hollow cylinder, a hollow squared tube, or a hollow elliptical tube. Besides, the planar master mold is preferred to be a caterpillar belt or a planar belt. Besides, the aforementioned particles 12 are preferred to be hollow micro glass particles. It is noteworthy to mention that the density of the particles 12 is less than that of the optical curing adhesive 11, such that the particles 21 are able to float on the optical curing adhesive 11 or the surface of the optical curing adhesive 11. Therefore, the particles 12 can be self-assembled on the surface of the master mold 21 when the master mold 21 is separated from the mixed liquid 10.

It is noteworthy to mention that the size of the particles 12, the volume proportion of the particles 12 to the optical curing adhesive 11, and the separation speed of the master mold 21 away from the mixed liquid 10 will all influence the self-assembly effect of the particles 12 on the master mold 21. Moreover, the size of the particles 12 is between 1-250 micrometer; the volume proportion of the particles 12 to the optical curing adhesive 11 is between 2-50%; the separation speed of the master mold 21 away from the mixed solution 10 is between 0.1-10 mm/min.

Additionally, a vertical stretching or a horizontal rotation dip-coating process is applied to achieve the self-assembly as the aforementioned master mold 21 is separating (as shown in FIGS. 1A and 1B) from the mixed solution 10. Besides, the separation methods of the present invention also comprise any means of immersing the master mold into the mixed solution and then extracting the master mold or the mixed solution.

Figure 2:
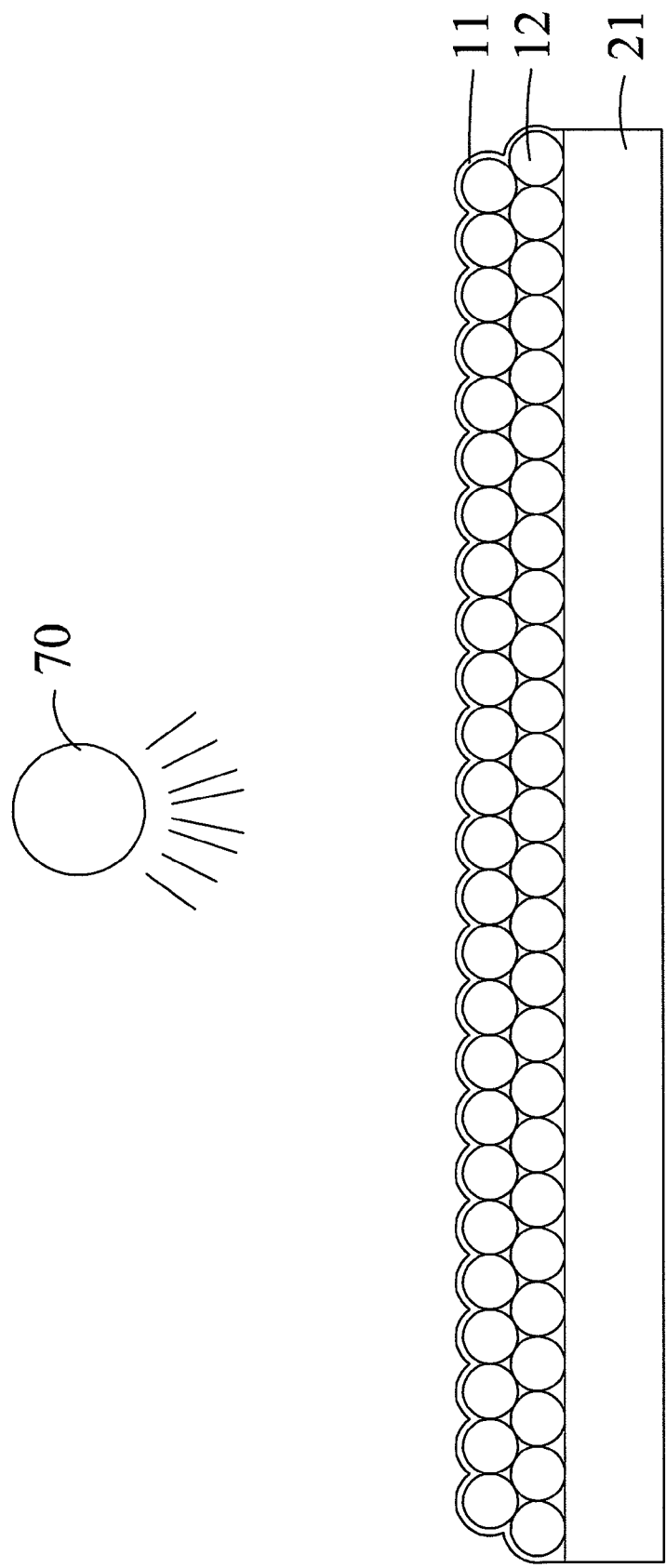
FIG. 2 is a diagram showing an optical curing process according to the preferred embodiment of the present invention of a method of manufacturing a substrate with a microstructure of the present invention.
Figure 3:
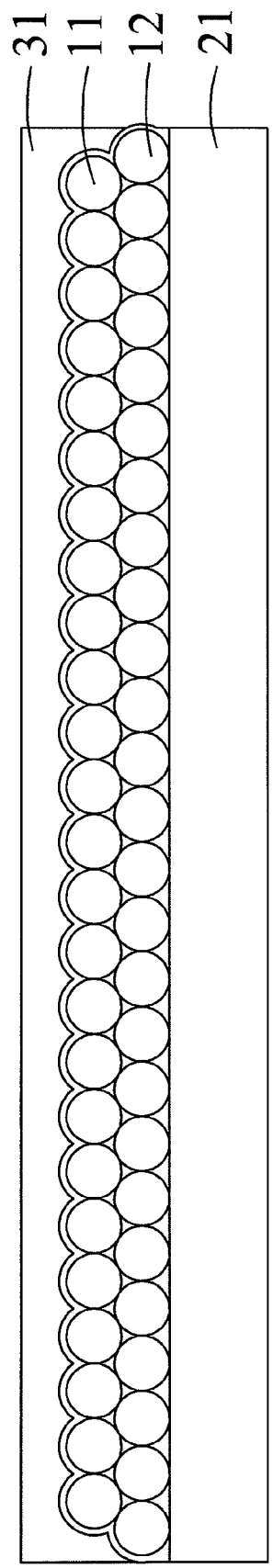
FIG. 3 is a first diagram showing a planar master mold imprinting according to the preferred embodiment of the present invention of a method of manufacturing a substrate with a microstructure of the present invention.

Additionally, referring to FIGS. 2 and 7, FIG. 2 is a diagram showing an optical curing process according to the preferred embodiment of the present invention of a method of manufacturing a substrate with a microstructure of the present invention. When the particles 12 are already self-assembled on the master mold 21, a light source 70 is provided to radiate the master mold 21 in Step 51 such that the particles 12 self-assembled on the master mold 21 are cured on the master mold 21 through the curing of the optical curing adhesive 11. Specifically, the substrate with a microstructure and method for producing the same of the present invention does not require to modify the surface of the master mold 21 to allow the particles 12 to adhere on the surface; this effect is achieved through the curing of the optical curing adhesive 11. Furthermore, the optical curing adhesive 11 is a UV-curable adhesive and the aforementioned light source is a UV light.

Figure 4:
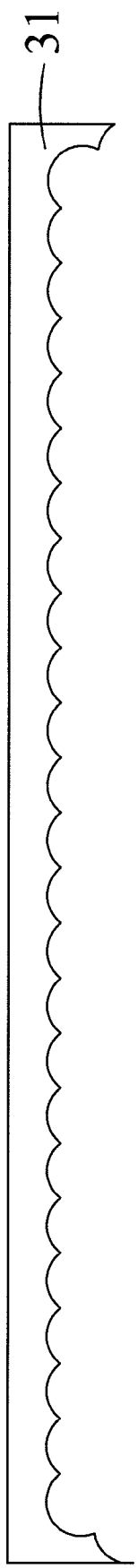
FIG. 4 is a second diagram showing a planar master mold imprinting according to the preferred embodiment of the present invention of a method of manufacturing a substrate with a microstructure of the present invention.
Figure 5:
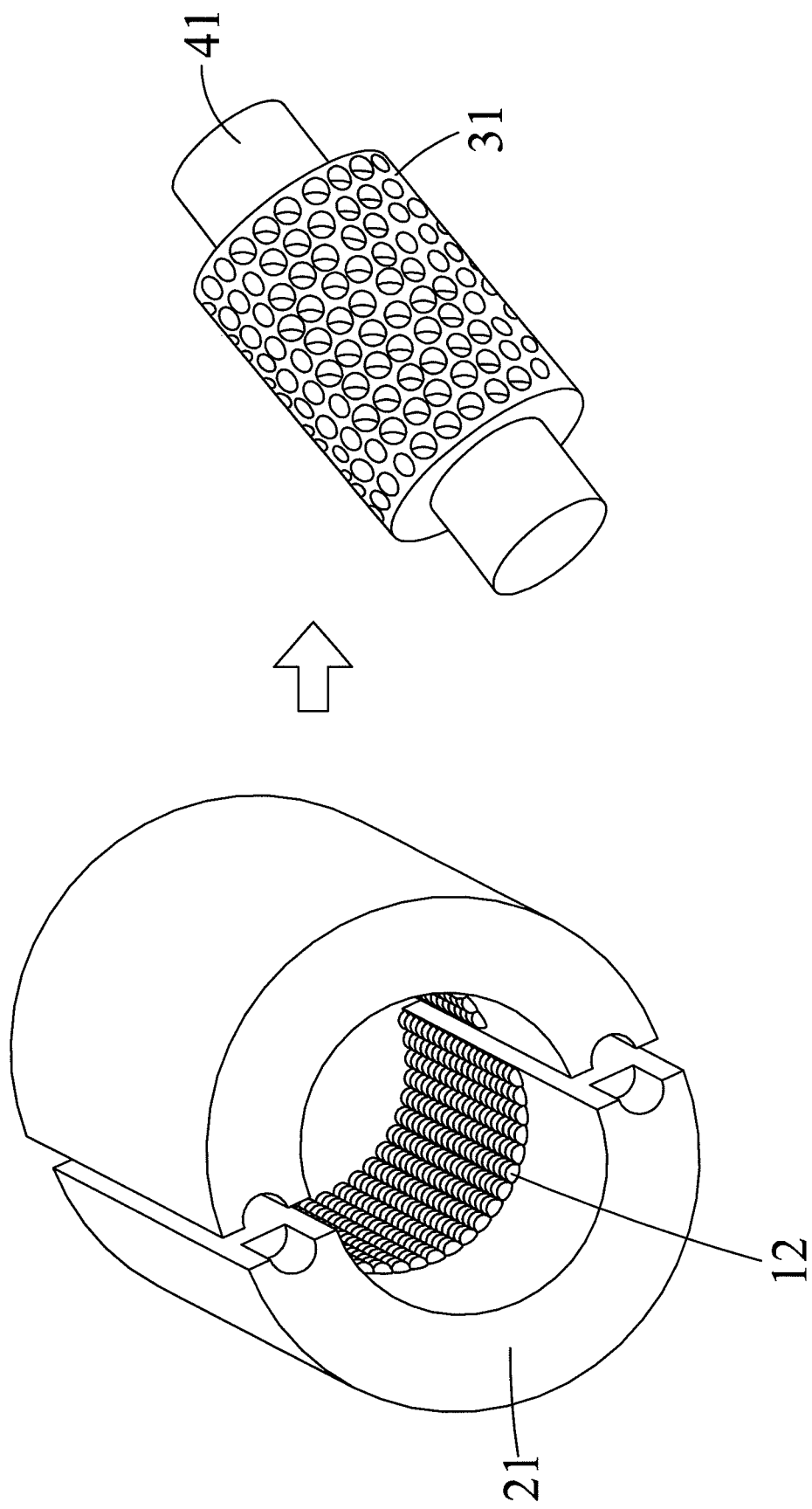
FIG. 5 is a diagram showing a hollow cylinder master mold imprinting according to the preferred embodiment of the present invention of a method of manufacturing a substrate with a microstructure of the present invention.

Furthermore, referring FIGS. 3, 4, 5, and 7, FIG. 3 is a first diagram showing a planar master mold imprinting according to the preferred embodiment of the present invention of a method of manufacturing a substrate with a microstructure of the present invention; FIG. 4 is a second diagram showing a planar master mold imprinting according to the preferred embodiment of the present invention of a method of manufacturing a substrate with a microstructure of the present invention; and FIG. 5 is a diagram showing a hollow cylinder master mold imprinting according to the preferred embodiment of the present invention of a method of manufacturing a substrate with a microstructure of the present invention. As the optical curing of Step 51 is finished, the next is a replication process of Step 52 to provide an inverse mold 31 with a concave surface and the concave and convex surface is corresponding to shapes of plurality of the particles 12 on the master mold 21. Specifically, if the shape of the particles 12 on the master mold 21 is spherical, the surface of the inverse mold 31 will possess depressions with the shapes close to a particle sphere or a half sphere, due to the fact that a single-layer or multi-layer of particles are disposed on the surface of the master mold 21.

Additionally, it is noteworthy to mention that the inverse mold is preferred to be fabricated by electroforming or polydimethylsiloxane (PDMS) casting.

Furthermore, a hollow cylinder of the master mold 21 is used as an embodiment of the present invention, as shown in FIG. 5. The master mold 21 is designed to be separable such that the inverse mold is easy to be removed.

Figure 6:
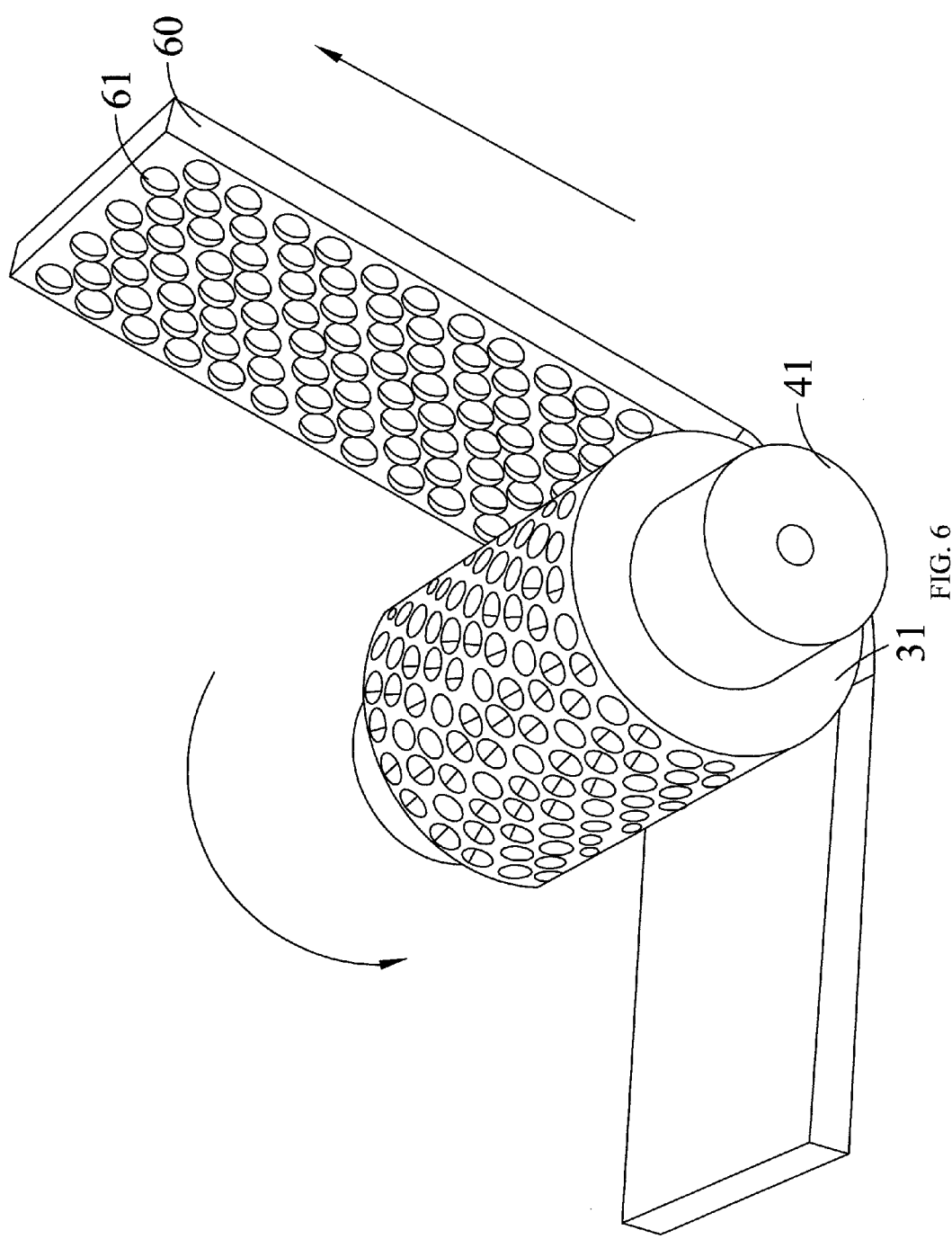
FIG. 6 is a diagram showing an inverse mold imprinting according to the preferred embodiment of the present invention of a method of manufacturing a substrate with a microstructure of the present invention.

Furthermore, referring to FIGS. 5-7, FIG. 6 is a diagram showing an inverse mold imprinting according to the preferred embodiment of the present invention of a method of manufacturing a substrate with a microstructure of the present invention. It is noteworthy to mention that the inverse mold is, for example, a roller inverse mold. Furthermore, an imprint process of Step 53 can be performed after the inverse mold 31 is generated, wherein the inverse mold 31 is used to imprint a substrate 60 to form a microstructure 61 on a surface of the substrate and the shape of the microstructure 61 is corresponding to that of the concave and convex surface. Specifically, as the concave and convex surface of the inverse mold 31 is imprinted on the substrate 60, a corresponding concave and convex surface will be generated on the substrate 60. The concave and convex surface on the substrate is the microstructure 61 of the present invention. Preferably, the microstructure 61 is a spherical array microstructure of a three dimensional random allocation. Furthermore, the characteristic of the three dimensional random allocation comes from the self-assembly process, i.e., the allocation of the microstructure does not show a regularity.

Preferably, the inverse mold 31 further comprises a mandrel 41 such that the inverse mold 31 is enabled to continuously perform Step 53 of the imprint by using the mandrel 41. The inverse mold 31 is preferred to be a roller mold.

Additionally, the present invention further proposes a substrate with a microstructure, wherein it is fabricated by using the aforementioned method. Specifically, the substrate 60 comprises a microstructure 61; this microstructure 61 is generated on the surface of the substrate 60 by the imprinting of the inverse mold 61.

In summation, although the present invention has been described with reference to the foregoing preferred embodiment, it will be understood that the invention is not limited to the details thereof. Various equivalent variations and modifications may still occur to those skilled in this art in view of the teachings of the present invention. Thus, all such variations and equivalent modifications are also embraced within the scope of the invention as defined in the appended claims.

What is claimed is:

1. A method for producing a substrate with a microstructure, comprising the following steps of:
    providing a mixed solution and a master mold, wherein the mixed solution comprises a plurality of particles and an optical curing adhesive, and the master mold is dip-coated in the mixed solution such that the plurality of particles are self-assembled on the surface of the master mold, wherein the density of the particles is less than the density of the optical curing adhesive, wherein the size of the particles is between 1-250 micrometer, the volume proportion of the particles to the optical curing adhesive is between 2-50%, the separation speed of the master mold away from the mixed solution is between 0.1-10 mm/min;
    providing the master mold with a light source, wherein the plurality of particles self-assembled on the master mold are fixed on the master mold by the curing of the optical curing adhesive;
    performing a replication step to provide a inverse mold with a concave and convex surface and the concave and convex surface is corresponding to shapes of the plurality of the particles on the master mold; and
    performing an imprint step, wherein the inverse mold is used to imprint a substrate to form a microstructure on a surface of the substrate and the shape of the microstructure is corresponding to that of the concave and convex surface.

2. The method for producing a substrate with a microstructure of claim 1, wherein the master mold is a hollow master mold or a planar master mold.

3. The method for producing a substrate with a microstructure of claim 2, wherein the hollow master mold is a hollow round cylinder, a hollow squared tube, or a hollow elliptical tube.

4. The method for producing a substrate with a microstructure of claim 2, wherein the planar master mold is a caterpillar belt or a planar belt.

5. The method for producing a substrate with a microstructure of claim 1, wherein the inverse mold is fabricated by electroforming or polydimethylsiloxane (PDMS) casting.

6. The method for producing a substrate with a microstructure of claim 5, wherein the inverse mold further comprises a mandrel such that the inverse mold is enabled to continuously perform the imprint step by using the mandrel.

7. The method for producing a substrate with a microstructure of claim 6, wherein the inverse mold is a roller mold.

8. The method for producing a substrate with a microstructure of claim 1, wherein the optical curing adhesive is a UV-curable adhesive.

* * * * *